United States Patent
Han et al.

(10) Patent No.: US 12,444,579 B2
(45) Date of Patent: Oct. 14, 2025

(54) MID-RING EROSION COMPENSATION IN SUBSTRATE PROCESSING SYSTEMS

(71) Applicant: LAM RESEARCH CORPORATION, Fremont, CA (US)

(72) Inventors: Hui Ling Han, Alameda, CA (US); Seetharaman Ramachandran, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 321 days.

(21) Appl. No.: 17/913,008

(22) PCT Filed: Mar. 23, 2020

(86) PCT No.: PCT/US2020/024333
§ 371 (c)(1),
(2) Date: Sep. 20, 2022

(87) PCT Pub. No.: WO2021/194470
PCT Pub. Date: Sep. 30, 2021

(65) Prior Publication Data
US 2023/0162953 A1    May 25, 2023

(51) Int. Cl.
*H01J 37/32*  (2006.01)
*H01L 21/687*  (2006.01)

(52) U.S. Cl.
CPC .. *H01J 37/32642* (2013.01); *H01J 37/32082* (2013.01); *H01L 21/68735* (2013.01);
(Continued)

(58) Field of Classification Search
CPC ........... H01J 37/32642; H01J 37/32082; H01J 2237/024; H01J 2237/24578;
(Continued)

(56) References Cited

U.S. PATENT DOCUMENTS

| | | | |
|---|---|---|---|
| 3,534,753 A | 10/1970 | Ollivier | |
| 4,262,686 A | 4/1981 | Heim et al. | |

(Continued)

FOREIGN PATENT DOCUMENTS

| | | |
|---|---|---|
| CN | 1189859 A | 8/1998 |
| CN | 1682344 A | 10/2005 |

(Continued)

OTHER PUBLICATIONS

Decision to Grant for Japanese Application No. 2022-557679 dated Feb. 28, 2024.
(Continued)

*Primary Examiner* — Anita K Alanko

(57) ABSTRACT

A substrate processing system includes a substrate support assembly to support a semiconductor substrate during processing of the semiconductor substrate in the substrate processing system. A first edge ring is arranged around the substrate support assembly. The first edge ring is movable relative to the substrate support assembly. A second edge ring is arranged around the substrate support assembly and under the first edge ring. A controller is configured to compensate a height of the first edge ring based on erosion of the first and second edge rings.

6 Claims, 5 Drawing Sheets

(52) U.S. Cl.
CPC .............. *H01J 2237/024* (2013.01); *H01J 2237/24578* (2013.01); *H01J 2237/24585* (2013.01); *H01J 2237/334* (2013.01)

(58) Field of Classification Search
CPC ...... H01J 2237/24585; H01J 2237/334; H01L 21/68735
See application file for complete search history.

(56) References Cited

U.S. PATENT DOCUMENTS

| | | |
|---|---|---|
| 4,374,698 A | 2/1983 | Sanders et al. |
| 4,431,477 A | 2/1984 | Zajac |
| 4,793,897 A | 12/1988 | Dunfield et al. |
| 5,190,823 A | 3/1993 | Anthony et al. |
| 5,220,515 A | 6/1993 | Freerks et al. |
| 5,304,248 A | 4/1994 | Cheng et al. |
| 5,329,965 A | 7/1994 | Gordon |
| 5,346,578 A | 9/1994 | Benzing et al. |
| 5,376,214 A | 12/1994 | Iwasaki et al. |
| 5,413,145 A | 5/1995 | Rhyne et al. |
| 5,520,969 A | 5/1996 | Nishizato et al. |
| 5,529,657 A | 6/1996 | Ishii |
| 5,569,350 A | 10/1996 | Osada et al. |
| 5,605,179 A | 2/1997 | Strong, Jr. et al. |
| 5,660,673 A | 8/1997 | Miyoshi |
| 5,662,143 A | 9/1997 | Caughran |
| 5,683,517 A | 11/1997 | Shan |
| 5,702,530 A | 12/1997 | Shan et al. |
| 5,744,695 A | 4/1998 | Forbes |
| 5,762,714 A | 6/1998 | Mohn et al. |
| 5,792,272 A | 8/1998 | van Os et al. |
| 5,837,058 A | 11/1998 | Chen et al. |
| 5,840,129 A | 11/1998 | Saenz et al. |
| 5,851,299 A | 12/1998 | Cheng et al. |
| 5,886,863 A | 3/1999 | Nagasaki et al. |
| 5,907,221 A | 5/1999 | Sato et al. |
| 5,942,039 A | 8/1999 | Kholodenko et al. |
| 5,952,060 A | 9/1999 | Ravi |
| 6,022,809 A | 2/2000 | Fan |
| 6,042,687 A | 3/2000 | Singh et al. |
| 6,044,534 A | 4/2000 | Seo et al. |
| 6,048,403 A | 4/2000 | Deaton et al. |
| 6,050,283 A | 4/2000 | Hoffman et al. |
| 6,060,400 A | 5/2000 | Oehrlein et al. |
| 6,062,256 A | 5/2000 | Miller et al. |
| 6,074,959 A | 6/2000 | Wang et al. |
| 6,152,168 A | 11/2000 | Ohmi et al. |
| 6,206,976 B1 | 3/2001 | Crevasse et al. |
| 6,210,593 B1 | 4/2001 | Ohkuni et al. |
| 6,217,937 B1 | 4/2001 | Shealy |
| 6,231,716 B1 | 5/2001 | White et al. |
| 6,294,466 B1 | 9/2001 | Chang |
| 6,328,808 B1 | 12/2001 | Tsai et al. |
| 6,376,386 B1 | 4/2002 | Oshima |
| 6,492,774 B1 | 12/2002 | Han et al. |
| 6,508,911 B1 | 1/2003 | Han et al. |
| 6,511,543 B1 | 1/2003 | Stauss et al. |
| 6,589,352 B1 | 7/2003 | Yudovsky et al. |
| 6,605,352 B1 | 8/2003 | Windischmann |
| 6,623,597 B1 | 9/2003 | Han et al. |
| 6,709,547 B1 | 3/2004 | Ni et al. |
| 6,722,642 B1 | 4/2004 | Sutton et al. |
| 6,736,931 B2 | 5/2004 | Collins et al. |
| 6,744,212 B2 | 6/2004 | Fischer et al. |
| 6,818,560 B1 | 11/2004 | Koshimizu et al. |
| 6,841,943 B2 | 1/2005 | Vahedi et al. |
| 6,896,765 B2 * | 5/2005 | Steger .............. H01J 37/32623 118/728 |
| 6,898,558 B2 | 5/2005 | Klekotka |
| 6,962,879 B2 | 11/2005 | Zhu et al. |
| 7,129,171 B2 | 10/2006 | Zhu et al. |
| 7,288,482 B2 | 10/2007 | Panda et al. |
| 7,309,646 B1 | 12/2007 | Heo et al. |
| 7,311,784 B2 | 12/2007 | Fink |
| 7,338,907 B2 | 3/2008 | Li et al. |
| 7,378,128 B2 | 5/2008 | Rancoule |
| 7,431,788 B2 | 10/2008 | Ricci et al. |
| 7,481,944 B2 | 1/2009 | Nozawa et al. |
| 7,736,998 B2 | 6/2010 | Morita et al. |
| 7,757,541 B1 | 7/2010 | Monkowski et al. |
| 7,758,698 B2 | 7/2010 | Bang et al. |
| 7,882,800 B2 | 2/2011 | Koshiishi et al. |
| 7,968,469 B2 | 6/2011 | Collins et al. |
| 7,988,813 B2 | 8/2011 | Chen et al. |
| 8,137,463 B2 | 3/2012 | Liu et al. |
| 8,177,910 B2 | 5/2012 | Schmid et al. |
| 8,291,935 B1 | 10/2012 | Merritt et al. |
| 8,485,128 B2 | 7/2013 | Kellogg et al. |
| 8,552,334 B2 | 10/2013 | Tappan et al. |
| 8,555,920 B2 | 10/2013 | Hirata et al. |
| 8,592,328 B2 | 11/2013 | Hausmann et al. |
| 8,826,855 B2 | 9/2014 | Kellogg et al. |
| 8,889,024 B2 | 11/2014 | Watanabe et al. |
| 8,956,980 B1 | 2/2015 | Chen et al. |
| 8,999,106 B2 | 4/2015 | Liu et al. |
| 9,011,637 B2 | 4/2015 | Yamamoto |
| 9,051,647 B2 | 6/2015 | Cooperberg et al. |
| 9,059,678 B2 | 6/2015 | Long et al. |
| 9,142,391 B2 | 9/2015 | Yamamoto |
| 9,318,343 B2 | 4/2016 | Ranjan et al. |
| 9,412,555 B2 | 8/2016 | Augustino et al. |
| 9,471,065 B2 | 10/2016 | Koyomogi et al. |
| 9,640,409 B1 | 5/2017 | Yang et al. |
| 9,698,042 B1 | 7/2017 | Baldasseroni et al. |
| 9,779,916 B2 | 10/2017 | Dhindsa et al. |
| 10,096,471 B2 | 10/2018 | Canniff |
| 10,147,588 B2 | 12/2018 | Eason et al. |
| 10,410,832 B2 | 9/2019 | Zhang et al. |
| 10,490,392 B2 | 11/2019 | Ishizawa |
| 10,504,738 B2 | 12/2019 | Lin et al. |
| 10,510,516 B2 | 12/2019 | Lin et al. |
| 10,591,934 B2 | 3/2020 | Gopalakrishnan et al. |
| 10,651,015 B2 | 5/2020 | Angelov et al. |
| 10,658,222 B2 | 5/2020 | Yan et al. |
| 10,699,878 B2 | 6/2020 | Caron et al. |
| 10,825,659 B2 | 11/2020 | Treadwell et al. |
| 10,957,561 B2 | 3/2021 | Drewery et al. |
| 11,798,789 B2 | 10/2023 | Sanchez et al. |
| 2001/0002581 A1 | 6/2001 | Nishikawa et al. |
| 2001/0004903 A1 | 6/2001 | Ohmi et al. |
| 2001/0013363 A1 | 8/2001 | Kitayama et al. |
| 2001/0035530 A1 | 11/2001 | Udagawa |
| 2002/0038669 A1 | 4/2002 | Yamagishi et al. |
| 2002/0042205 A1 | 4/2002 | McMillin et al. |
| 2002/0043337 A1 | 4/2002 | Goodman et al. |
| 2002/0045265 A1 | 4/2002 | Bergh et al. |
| 2002/0046991 A1 | 4/2002 | Smith et al. |
| 2002/0048536 A1 | 4/2002 | Bergh et al. |
| 2002/0053513 A1 | 5/2002 | Stimson et al. |
| 2002/0067585 A1 | 6/2002 | Fujiwara |
| 2002/0071128 A1 | 6/2002 | Doan |
| 2002/0072240 A1 | 6/2002 | Koike |
| 2002/0088542 A1 | 7/2002 | Nishikawa et al. |
| 2002/0092602 A1 | 7/2002 | Saito et al. |
| 2002/0160125 A1 | 10/2002 | Johnson et al. |
| 2002/0174905 A1 | 11/2002 | Latino et al. |
| 2002/0175144 A1 | 11/2002 | Hung et al. |
| 2003/0000369 A1 | 1/2003 | Funaki |
| 2003/0003696 A1 | 1/2003 | Gelatos et al. |
| 2003/0011619 A1 | 1/2003 | Jacobs et al. |
| 2003/0013080 A1 | 1/2003 | Luebke et al. |
| 2003/0015141 A1 | 1/2003 | Takagi |
| 2003/0021356 A1 | 1/2003 | Okuda et al. |
| 2003/0023023 A1 | 1/2003 | Harris et al. |
| 2003/0116195 A1 | 6/2003 | Weissgerber et al. |
| 2003/0130807 A1 | 7/2003 | Ambrosina et al. |
| 2003/0186563 A1 | 10/2003 | Kobayashi et al. |
| 2003/0196890 A1 | 10/2003 | Le et al. |
| 2003/0201069 A1 | 10/2003 | Johnson |
| 2003/0213560 A1 | 11/2003 | Wang et al. |
| 2003/0230239 A1 | 12/2003 | Shan |
| 2003/0231950 A1 | 12/2003 | Raaijmakers |
| 2003/0236592 A1 | 12/2003 | Shajii et al. |

(56) References Cited

U.S. PATENT DOCUMENTS

| | | |
|---|---|---|
| 2003/0236638 A1 | 12/2003 | Shajii et al. |
| 2003/0236643 A1 | 12/2003 | Shajii et al. |
| 2004/0007176 A1 | 1/2004 | Janakiraman et al. |
| 2004/0025060 A1 | 2/2004 | Raffaele et al. |
| 2004/0026149 A1 | 2/2004 | Wilkinson |
| 2004/0031338 A1 | 2/2004 | Chen et al. |
| 2004/0053428 A1 | 3/2004 | Steger |
| 2004/0060595 A1 | 4/2004 | Chittenden |
| 2004/0089240 A1 | 5/2004 | Dando et al. |
| 2004/0094206 A1 | 5/2004 | Ishida |
| 2004/0112538 A1 | 6/2004 | Larson et al. |
| 2004/0112539 A1 | 6/2004 | Larson et al. |
| 2004/0112540 A1 | 6/2004 | Larson et al. |
| 2004/0149389 A1 | 8/2004 | Fink |
| 2004/0163601 A1 | 8/2004 | Kadotani et al. |
| 2004/0168719 A1 | 9/2004 | Nambu |
| 2004/0173270 A1 | 9/2004 | Harris et al. |
| 2004/0200529 A1 | 10/2004 | Lull et al. |
| 2004/0250600 A1 | 12/2004 | Bevers et al. |
| 2004/0261492 A1 | 12/2004 | Zarkar et al. |
| 2005/0005994 A1 | 1/2005 | Sugiyama et al. |
| 2005/0041238 A1 | 2/2005 | Ludviksson et al. |
| 2005/0061447 A1 | 3/2005 | Kim et al. |
| 2005/0067021 A1 | 3/2005 | Bevers et al. |
| 2005/0082007 A1 | 4/2005 | Nguyen et al. |
| 2005/0133164 A1 | 6/2005 | Fischer et al. |
| 2005/0155625 A1 | 7/2005 | Jangjian et al. |
| 2005/0199342 A1 | 9/2005 | Shajii et al. |
| 2005/0241763 A1 | 11/2005 | Huang et al. |
| 2006/0011237 A1 | 1/2006 | Tison et al. |
| 2006/0021223 A1 | 2/2006 | Wakayama et al. |
| 2006/0060141 A1 | 3/2006 | Kamaishi et al. |
| 2006/0090797 A1 | 5/2006 | Olander |
| 2006/0097644 A1 | 5/2006 | Kono et al. |
| 2006/0124169 A1 | 6/2006 | Mizusawa et al. |
| 2006/0207595 A1 | 9/2006 | Ohmi et al. |
| 2006/0212233 A1 | 9/2006 | Wong et al. |
| 2006/0237063 A1 | 10/2006 | Ding et al. |
| 2006/0283551 A1 | 12/2006 | Son |
| 2007/0023398 A1 | 2/2007 | Kobayashi et al. |
| 2007/0024077 A1 | 2/2007 | McClintock |
| 2007/0026684 A1 | 2/2007 | Parascandola et al. |
| 2007/0066038 A1 | 3/2007 | Sadjadi et al. |
| 2007/0131350 A1 | 6/2007 | Ricci et al. |
| 2007/0158025 A1 | 7/2007 | Larson |
| 2007/0175391 A1 | 8/2007 | Mizusawa |
| 2007/0187363 A1 | 8/2007 | Oka et al. |
| 2007/0204797 A1 | 9/2007 | Fischer |
| 2007/0204914 A1 | 9/2007 | Kurosawa et al. |
| 2007/0208427 A1 | 9/2007 | Davidson et al. |
| 2007/0233412 A1 | 10/2007 | Gotoh et al. |
| 2007/0240778 A1 | 10/2007 | L'Bassi et al. |
| 2007/0256785 A1 | 11/2007 | Pamarthy et al. |
| 2007/0256786 A1 | 11/2007 | Zhou et al. |
| 2007/0259112 A1 | 11/2007 | Ishikawa et al. |
| 2007/0283882 A1 | 12/2007 | Cho et al. |
| 2007/0284344 A1 | 12/2007 | Todorov et al. |
| 2008/0014347 A1 | 1/2008 | Power |
| 2008/0072823 A1 | 3/2008 | Yudovsky et al. |
| 2008/0101978 A1 | 5/2008 | Ryabova et al. |
| 2008/0115834 A1 | 5/2008 | Geoffrion et al. |
| 2008/0121177 A1 | 5/2008 | Bang et al. |
| 2008/0121178 A1 | 5/2008 | Bang et al. |
| 2008/0174387 A1 | 7/2008 | Chiang |
| 2008/0202588 A1 | 8/2008 | Gold et al. |
| 2008/0202609 A1 | 8/2008 | Gold et al. |
| 2008/0202610 A1 | 8/2008 | Gold et al. |
| 2008/0223873 A1 | 9/2008 | Chen et al. |
| 2008/0236749 A1 | 10/2008 | Koshimizu et al. |
| 2008/0261800 A1 | 10/2008 | Yuan et al. |
| 2008/0314508 A1 | 12/2008 | Ricci et al. |
| 2008/0317564 A1 | 12/2008 | Cheng et al. |
| 2009/0015141 A1 | 1/2009 | Wang et al. |
| 2009/0056629 A1 | 3/2009 | Katz et al. |
| 2009/0061083 A1 | 3/2009 | Chiang et al. |
| 2009/0061640 A1 | 3/2009 | Wong et al. |
| 2009/0061644 A1 | 3/2009 | Chiang et al. |
| 2009/0067954 A1 | 3/2009 | Lanee et al. |
| 2009/0078196 A1 | 3/2009 | Midorikawa |
| 2009/0090174 A1 | 4/2009 | Paul et al. |
| 2009/0095364 A1 | 4/2009 | Itoh et al. |
| 2009/0151419 A1 | 6/2009 | Doniat et al. |
| 2009/0162952 A1 | 6/2009 | Liu et al. |
| 2009/0163037 A1 | 6/2009 | Miya et al. |
| 2009/0183548 A1 | 7/2009 | Monkowski et al. |
| 2009/0183549 A1 | 7/2009 | Monkowski et al. |
| 2009/0197423 A1 | 8/2009 | Koshimizu et al. |
| 2009/0209112 A1 | 8/2009 | Koelmel et al. |
| 2009/0221117 A1 | 9/2009 | Tan et al. |
| 2009/0236313 A1 | 9/2009 | Qiu et al. |
| 2009/0272717 A1 | 11/2009 | Pamarthy et al. |
| 2009/0279989 A1 | 11/2009 | Wong et al. |
| 2009/0320754 A1 | 12/2009 | Oya et al. |
| 2010/0012310 A1 | 1/2010 | Christensen et al. |
| 2010/0025369 A1 | 2/2010 | Negishi et al. |
| 2010/0030390 A1 | 2/2010 | Yamaguchi et al. |
| 2010/0059181 A1 | 3/2010 | Lee et al. |
| 2010/0071438 A1 | 3/2010 | Davis et al. |
| 2010/0108261 A1 | 5/2010 | Augustino et al. |
| 2010/0122655 A1 | 5/2010 | Tiner et al. |
| 2010/0144539 A1 | 6/2010 | Bergh et al. |
| 2010/0145633 A1 | 6/2010 | Yasuda |
| 2010/0178770 A1 | 7/2010 | Zin |
| 2010/0197070 A1 | 8/2010 | Stoddard et al. |
| 2010/0216313 A1 | 8/2010 | Iwai |
| 2010/0229976 A1 | 9/2010 | Hirata et al. |
| 2010/0264117 A1 | 10/2010 | Ohmi et al. |
| 2010/0269924 A1 | 10/2010 | Yasuda |
| 2010/0272347 A1 | 10/2010 | Rodnick et al. |
| 2010/0273334 A1 | 10/2010 | Koelmel et al. |
| 2011/0019332 A1 | 1/2011 | Chistyakov |
| 2011/0025322 A1 | 2/2011 | Yamazaki et al. |
| 2011/0026588 A1 | 2/2011 | Boyce |
| 2011/0026595 A1 | 2/2011 | Yasuda et al. |
| 2011/0031111 A1 | 2/2011 | Kobayashi |
| 2011/0094596 A1 | 4/2011 | Sugiyama et al. |
| 2011/0108524 A1 | 5/2011 | Dhindsa et al. |
| 2011/0126984 A1 | 6/2011 | Kang et al. |
| 2011/0135821 A1 | 6/2011 | Ding |
| 2011/0157760 A1 | 6/2011 | Willwerth et al. |
| 2011/0229837 A1 | 9/2011 | Migita |
| 2011/0253225 A1 | 10/2011 | Beeby et al. |
| 2011/0259262 A1 | 10/2011 | Khattak et al. |
| 2011/0265883 A1 | 11/2011 | Cruse et al. |
| 2011/0265951 A1 | 11/2011 | Xu et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0032756 A1 | 2/2012 | Long et al. |
| 2012/0034786 A1 | 2/2012 | Dhindsa et al. |
| 2012/0080092 A1 | 4/2012 | Singh et al. |
| 2012/0091108 A1 | 4/2012 | Lin et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0175062 A1 | 7/2012 | de la Llera et al. |
| 2012/0176692 A1 | 7/2012 | Yamawaku et al. |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0247386 A1 | 10/2012 | Sanchez et al. |
| 2012/0280429 A1 | 11/2012 | Ravi et al. |
| 2012/0282162 A1 | 11/2012 | Skelton et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0312800 A1 | 12/2012 | Chartier et al. |
| 2012/0328780 A1 | 12/2012 | Yamagishi |
| 2013/0000731 A1 | 1/2013 | Singh et al. |
| 2013/0008607 A1 | 1/2013 | Matsumoto et al. |
| 2013/0025715 A1 | 1/2013 | Yamaguchi et al. |

(56) References Cited

U.S. PATENT DOCUMENTS

| | | |
|---|---|---|
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0135058 A1 | 5/2013 | Long et al. |
| 2013/0145816 A1 | 6/2013 | Lowe |
| 2013/0155568 A1 | 6/2013 | Todorow et al. |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0256962 A1 | 10/2013 | Ranish et al. |
| 2013/0270997 A1 | 10/2013 | Zhao et al. |
| 2013/0284374 A1 | 10/2013 | Lubomirsky et al. |
| 2013/0288477 A1 | 10/2013 | Rieschl et al. |
| 2013/0313785 A1 | 11/2013 | Otschik et al. |
| 2013/0334038 A1 | 12/2013 | Riker et al. |
| 2014/0017900 A1 | 1/2014 | Doba et al. |
| 2014/0020764 A1 | 1/2014 | Woelk et al. |
| 2014/0033828 A1 | 2/2014 | Larson et al. |
| 2014/0034243 A1 | 2/2014 | Dhindsa et al. |
| 2014/0080308 A1 | 3/2014 | Chen et al. |
| 2014/0094039 A1 | 4/2014 | Ranish et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0190822 A1 | 7/2014 | Riker et al. |
| 2014/0213055 A1 | 7/2014 | Himori et al. |
| 2014/0235063 A1 | 8/2014 | McMillin et al. |
| 2014/0248780 A1 | 9/2014 | Ingle et al. |
| 2014/0262038 A1 | 9/2014 | Wang et al. |
| 2014/0262763 A1 | 9/2014 | Rasheed et al. |
| 2014/0263177 A1 | 9/2014 | Povolny et al. |
| 2014/0272459 A1 | 9/2014 | Daugherty et al. |
| 2014/0273460 A1 | 9/2014 | Reyland et al. |
| 2014/0273505 A1 | 9/2014 | Hsieh et al. |
| 2014/0311676 A1 | 10/2014 | Hatoh et al. |
| 2015/0009906 A1 | 1/2015 | Dore et al. |
| 2015/0010381 A1 | 1/2015 | Cai |
| 2015/0017810 A1 | 1/2015 | Guha |
| 2015/0037183 A1 | 2/2015 | Rood et al. |
| 2015/0044873 A1 | 2/2015 | Kellogg |
| 2015/0059859 A1 | 3/2015 | Takahashi et al. |
| 2015/0099066 A1 | 4/2015 | Huotari et al. |
| 2015/0099365 A1 | 4/2015 | Chen et al. |
| 2015/0107773 A1 | 4/2015 | Shintaku et al. |
| 2015/0179412 A1 | 6/2015 | Chhatre et al. |
| 2015/0181684 A1 | 6/2015 | Banna et al. |
| 2015/0184287 A1 | 7/2015 | Tsung et al. |
| 2015/0187631 A1 | 7/2015 | Ranish et al. |
| 2015/0234390 A1 | 8/2015 | Koyomogi et al. |
| 2015/0262793 A1 | 9/2015 | Okunishi et al. |
| 2015/0287572 A1 | 10/2015 | Daugherty et al. |
| 2015/0336275 A1 | 11/2015 | Mazzocco et al. |
| 2015/0340209 A1 | 11/2015 | Koltonski |
| 2015/0371831 A1 | 12/2015 | Rozenzon et al. |
| 2015/0373783 A1 | 12/2015 | Kitagawa |
| 2016/0035610 A1 | 2/2016 | Park et al. |
| 2016/0039126 A1 | 2/2016 | Tan et al. |
| 2016/0046451 A1 | 2/2016 | German |
| 2016/0099162 A1 | 4/2016 | Ng et al. |
| 2016/0111258 A1 | 4/2016 | Taskar et al. |
| 2016/0172165 A1 | 6/2016 | Jeon et al. |
| 2016/0181116 A1 | 6/2016 | Berry, III et al. |
| 2016/0204019 A1 | 7/2016 | Ishii et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2016/0307742 A1 | 10/2016 | Mishra et al. |
| 2016/0372321 A1 | 12/2016 | Krishnan et al. |
| 2017/0011892 A1 | 1/2017 | Guo et al. |
| 2017/0018407 A1 | 1/2017 | Kondo |
| 2017/0032982 A1 | 2/2017 | Drewery et al. |
| 2017/0040148 A1 | 2/2017 | Augustino et al. |
| 2017/0043527 A1 | 2/2017 | Uttaro |
| 2017/0062769 A1 | 3/2017 | Kim et al. |
| 2017/0069464 A1 | 3/2017 | Ye et al. |
| 2017/0069511 A1 | 3/2017 | Yang et al. |
| 2017/0110335 A1 | 4/2017 | Yang et al. |
| 2017/0111025 A1 | 4/2017 | Kapoor et al. |
| 2017/0113355 A1 | 4/2017 | Genetti et al. |
| 2017/0115657 A1 | 4/2017 | Trussell et al. |
| 2017/0125274 A1 | 5/2017 | Swaminathan et al. |
| 2017/0133283 A1 | 5/2017 | Kenworthy |
| 2017/0200586 A1 | 7/2017 | Treadwell et al. |
| 2017/0213751 A1 | 7/2017 | Oohashi |
| 2017/0213758 A1 | 7/2017 | Rice et al. |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0256393 A1 | 9/2017 | Kim et al. |
| 2017/0256435 A1 | 9/2017 | Joubert et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0326733 A1 | 11/2017 | Ramachandran et al. |
| 2018/0019107 A1 | 1/2018 | Ishizawa |
| 2018/0052104 A1 | 2/2018 | Larsson et al. |
| 2018/0053629 A1 | 2/2018 | Zhang et al. |
| 2018/0114716 A1 | 4/2018 | Hao et al. |
| 2018/0138069 A1 | 5/2018 | Tan et al. |
| 2018/0155838 A1 | 6/2018 | Rasheed et al. |
| 2018/0166259 A1 | 6/2018 | Ueda |
| 2018/0190526 A1 | 7/2018 | Hao et al. |
| 2018/0218933 A1 | 8/2018 | Luere et al. |
| 2018/0277416 A1 | 9/2018 | Takahashi et al. |
| 2018/0358211 A1 | 12/2018 | Mun |
| 2019/0013232 A1 | 1/2019 | Yan et al. |
| 2019/0027988 A1 | 1/2019 | Filipenko et al. |
| 2019/0103722 A1 | 4/2019 | Kieu |
| 2019/0228952 A1 | 7/2019 | Dorf et al. |
| 2019/0279888 A1 | 9/2019 | Gopalakrishnan et al. |
| 2019/0363003 A1 | 11/2019 | Sarode Vishwanath |
| 2020/0004954 A1 | 1/2020 | Zawadowskiy et al. |
| 2020/0020565 A1 | 1/2020 | Rathnasinghe et al. |
| 2020/0049547 A1 | 2/2020 | Spyropoulos et al. |
| 2020/0234928 A1 | 7/2020 | Vishwanath |
| 2020/0234981 A1 | 7/2020 | Schmid et al. |
| 2020/0303224 A1 | 9/2020 | Yoshimori |
| 2020/0312633 A1 | 10/2020 | Rathnasinghe et al. |
| 2020/0328105 A1* | 10/2020 | Sun ................ H01J 37/32082 |
| 2020/0395195 A1 | 12/2020 | Sanchez et al. |
| 2021/0057256 A1 | 2/2021 | Bergantz et al. |
| 2021/0066052 A1 | 3/2021 | Emura |
| 2021/0111007 A1 | 4/2021 | Kim et al. |
| 2021/0291374 A1 | 9/2021 | Bergantz et al. |
| 2021/0327688 A1 | 10/2021 | Sasaki et al. |
| 2021/0384013 A1 | 12/2021 | Jung et al. |
| 2022/0122878 A1 | 4/2022 | Wu et al. |
| 2022/0246408 A1 | 8/2022 | Genetti et al. |
| 2022/0254612 A1 | 8/2022 | Kimball et al. |
| 2022/0270863 A1 | 8/2022 | Kimball et al. |
| 2022/0319904 A1 | 10/2022 | Rice et al. |
| 2022/0359169 A1 | 11/2022 | Koai et al. |

FOREIGN PATENT DOCUMENTS

| | | |
|---|---|---|
| CN | 1701421 A | 11/2005 |
| CN | 101238553 A | 8/2008 |
| CN | 101552182 A | 10/2009 |
| CN | 102243977 A | 11/2011 |
| CN | 202076225 U | 12/2011 |
| CN | 102315150 A | 1/2012 |
| CN | 102610476 A | 7/2012 |
| CN | 103730318 A | 4/2014 |
| CN | 104205321 A | 12/2014 |
| CN | 104299929 A | 1/2015 |

(56) References Cited

FOREIGN PATENT DOCUMENTS

| | | |
|---|---|---|
| CN | 104752141 A | 7/2015 |
| CN | 104851832 A | 8/2015 |
| CN | 105336561 A | 2/2016 |
| CN | 105810609 A | 7/2016 |
| CN | 106469637 A | 3/2017 |
| CN | 107086168 A | 8/2017 |
| CN | 107093569 A | 8/2017 |
| CN | 107768275 A | 3/2018 |
| CN | 108369922 A | 8/2018 |
| CN | 112563108 A | 3/2021 |
| CN | 212874484 U | 4/2021 |
| EP | 0424299 A2 | 4/1991 |
| EP | 0821403 A2 | 1/1998 |
| EP | 0821404 A2 | 1/1998 |
| EP | 0838842 A2 | 4/1998 |
| EP | 0875979 A1 | 11/1998 |
| EP | EU-0875919 A2 | 11/1998 |
| EP | 1202328 A2 | 5/2002 |
| JP | H02-93063 A | 4/1990 |
| JP | H07106316 A | 4/1995 |
| JP | H07221024 A | 8/1995 |
| JP | H10-280173 A | 10/1998 |
| JP | 2000036488 A | 2/2000 |
| JP | 20000124141 A | 4/2000 |
| JP | 3076791 B2 | 8/2000 |
| JP | 2001-230239 A | 8/2001 |
| JP | 2001522142 A | 11/2001 |
| JP | 2002500439 A | 1/2002 |
| JP | 2002503765 A | 2/2002 |
| JP | 2002-176030 A | 6/2002 |
| JP | 2002-217171 A | 8/2002 |
| JP | 2002-231794 A | 8/2002 |
| JP | 2003-513434 A | 4/2003 |
| JP | 2004-266127 A | 9/2004 |
| JP | 2004296553 A | 10/2004 |
| JP | 2006173223 A | 6/2006 |
| JP | 2006186171 A | 7/2006 |
| JP | 2006-344701 A | 12/2006 |
| JP | 2007207808 A | 8/2007 |
| JP | 2007-234867 A | 9/2007 |
| JP | 2007321244 A | 12/2007 |
| JP | 2007535819 A | 12/2007 |
| JP | 2008027936 A | 2/2008 |
| JP | 2008159931 A | 7/2008 |
| JP | 2008-244274 A | 10/2008 |
| JP | 2008-251681 A | 10/2008 |
| JP | 2010034416 A | 2/2010 |
| JP | 2010267894 A | 11/2010 |
| JP | 2011-54933 A | 3/2011 |
| JP | 2011210853 A | 10/2011 |
| JP | 2012-049376 A | 3/2012 |
| JP | 201264671 A | 3/2012 |
| JP | 2012507860 A | 3/2012 |
| JP | 2012-146743 A | 8/2012 |
| JP | 2012216614 A | 11/2012 |
| JP | 2012222235 A | 11/2012 |
| JP | 201342012 A | 2/2013 |
| JP | 2013511847 A | 4/2013 |
| JP | 2013526063 A | 6/2013 |
| JP | 2013530516 A | 7/2013 |
| JP | 2013172013 A | 9/2013 |
| JP | 2014084523 A | 5/2014 |
| JP | 2015109249 A | 6/2015 |
| JP | 2015115421 A | 6/2015 |
| JP | 5767373 B2 | 8/2015 |
| JP | 2015201552 A | 11/2015 |
| JP | 2016046451 A | 4/2016 |
| JP | 2016-146472 A | 8/2016 |
| JP | 2016530706 A | 9/2016 |
| JP | 2016-219820 A | 12/2016 |
| JP | 3210105 U | 4/2017 |
| JP | 2017085072 A | 5/2017 |
| JP | 2017092435 A | 5/2017 |
| JP | 2017092448 A | 5/2017 |
| JP | 2017131927 A | 8/2017 |
| JP | 2017183701 A | 10/2017 |
| JP | 2018010992 A | 1/2018 |
| JP | 2018098239 A | 6/2018 |
| JP | 2018125519 A | 8/2018 |
| JP | 2018160666 A | 10/2018 |
| JP | 2019505088 A | 2/2019 |
| JP | 2019192734 A | 10/2019 |
| JP | 2020043137 A | 3/2020 |
| JP | 2020519016 A | 6/2020 |
| JP | 2022031361 A | 2/2022 |
| KR | 10-1998-0086673 A | 12/1998 |
| KR | 19980086673 A | 12/1998 |
| KR | 20010112277 A | 12/2001 |
| KR | 20020002704 A | 1/2002 |
| KR | 20020031417 A | 5/2002 |
| KR | 1020020031417 A | 5/2002 |
| KR | 20020071398 A | 9/2002 |
| KR | 20030065126 A | 8/2003 |
| KR | 20040050080 A | 6/2004 |
| KR | 20050008792 A | 1/2005 |
| KR | 2005-0038898 A | 4/2005 |
| KR | 100578129 B1 | 5/2006 |
| KR | 20070073704 A | 7/2007 |
| KR | 100783062 B1 | 12/2007 |
| KR | 100803858 B1 | 2/2008 |
| KR | 20080013552 A | 2/2008 |
| KR | 20080023569 A | 3/2008 |
| KR | 100849179 B1 | 7/2008 |
| KR | 20090024075 A | 3/2009 |
| KR | 20090080520 A | 7/2009 |
| KR | 1020090080520 A | 7/2009 |
| KR | 20090094290 A | 9/2009 |
| KR | 2010-0105695 A | 9/2010 |
| KR | 20100123724 A | 11/2010 |
| KR | 20110005665 U | 6/2011 |
| KR | 2011-0125188 A | 11/2011 |
| KR | 20110123519 A | 11/2011 |
| KR | 20110137775 A | 12/2011 |
| KR | 2013-0124616 A | 11/2013 |
| KR | 20130137962 A | 12/2013 |
| KR | 20140001540 A | 1/2014 |
| KR | 2014-0101870 A | 8/2014 |
| KR | 2014-0103872 A | 8/2014 |
| KR | 2014-0132542 A | 11/2014 |
| KR | 20160014088 A | 2/2016 |
| KR | 10-2016-0063412 A | 6/2016 |
| KR | 20167013192 | 6/2016 |
| KR | 10-2016-0088820 A | 7/2016 |
| KR | 20160088820 A | 7/2016 |
| KR | 2017-0037526 A | 4/2017 |
| KR | 20180099776 A | 9/2018 |
| KR | 101927936 B1 | 12/2018 |
| KR | 20190017721 A | 2/2019 |
| KR | 20190026898 A | 3/2019 |
| KR | 10-1974422 B1 | 5/2019 |
| KR | 101974420 B1 | 5/2019 |
| KR | 20190068490 A | 6/2019 |
| TW | 506234 B | 10/2002 |
| TW | 200302035 A | 7/2003 |
| TW | 200520137 A | 6/2005 |
| TW | 200525635 A | 8/2005 |
| TW | I267563 B | 12/2006 |
| TW | 201001588 A | 1/2010 |
| TW | 201207933 A | 2/2012 |
| TW | 201246327 A | 11/2012 |
| TW | 201324653 A | 6/2013 |
| TW | 201347063 A | 11/2013 |
| TW | 201351532 A | 12/2013 |
| TW | 201426854 A | 7/2014 |
| TW | 201436089 A | 9/2014 |
| TW | 201447965 A | 12/2014 |
| TW | 201503209 A | 1/2015 |
| TW | M492915 U | 1/2015 |
| TW | 201528310 A | 7/2015 |
| TW | 201532106 A | 8/2015 |
| TW | 201601208 A | 1/2016 |
| TW | 201626427 A | 7/2016 |
| TW | 201630107 A | 8/2016 |
| TW | 201639074 A | 11/2016 |

(56) References Cited

FOREIGN PATENT DOCUMENTS

| | | |
|---|---|---|
| TW | 201719709 A | 6/2017 |
| TW | 201737290 A | 10/2017 |
| TW | 201742102 A | 12/2017 |
| TW | 201817899 A | 5/2018 |
| TW | 201926536 A | 7/2019 |
| TW | 201935593 A | 9/2019 |
| WO | WO-0040776 A1 | 7/2000 |
| WO | WO-0113404 A1 | 2/2001 |
| WO | WO-2007008509 A2 | 1/2007 |
| WO | WO-2009086109 A2 | 7/2009 |
| WO | WO-2011051251 A1 | 5/2011 |
| WO | WO-2013108750 A1 | 7/2013 |
| WO | WO-2013123617 A1 | 8/2013 |
| WO | WO-2014068886 A1 | 5/2014 |
| WO | WO-2014163742 A1 | 10/2014 |
| WO | WO-2014209492 A1 | 12/2014 |
| WO | WO-2017131927 A1 | 8/2017 |
| WO | WO-2017155812 A1 | 9/2017 |
| WO | WO-2018010986 A1 | 1/2018 |
| WO | WO-2019022707 A1 | 1/2019 |
| WO | WO-2019022708 A1 | 1/2019 |
| WO | WO-2019103722 A1 | 5/2019 |
| WO | WO-2019112903 A1 | 6/2019 |
| WO | WO-2019143858 A1 | 7/2019 |
| WO | WO-2020036613 A1 | 2/2020 |
| WO | WO-2020-180656 A1 | 9/2020 |
| WO | WO-2021025934 A1 | 2/2021 |
| WO | WO-2021026110 A1 | 2/2021 |
| WO | WO-2021030184 A1 | 2/2021 |
| WO | WO-2021-167897 A1 | 8/2021 |
| WO | WO-2021-194470 A1 | 9/2021 |
| WO | WO-2022076227 A1 | 4/2022 |

OTHER PUBLICATIONS

European Examination Report for European Application No. 21161965.5 dated Jul. 27, 2023.
Extended European Search Report from European Application No. 22156901.5 dated Jun. 27, 2022.
First Office Action from Taiwanese Application No. 109126470 dated Jun. 28, 2024.
Japanese Office Action and Search Report for Japanese Application No. 2022-508752 dated Jul. 25, 2024.
Korean Decision for Grant of Patent for Korean Application No. 10-2023-7035339 dated Jul. 30, 2024.
Office Action from Korean Application No. 10-2022-7007496 dated Aug. 21, 2024.
Office Action from Korean Application No. 10-2022-7007791, dated Jul. 22, 2024.
Search Report from Korean Application No. 10-2023-7037449, dated Nov. 16, 2023.
International Search Report and Written Opinion of the ISA issued in PCT/US2020/024333, mailed Dec. 24, 2020; ISA/KR.
European Extended Search Report dated Jun. 6, 2022 issued in EP 18929891.2.
Examination Report issued in corresponding European Patent Application 18929891.2 dated Jul. 3, 2023.
Korean Notice of Preliminary Examination Result for Korean Application No. 10-2023-7037853 dated Dec. 6, 2023.
L. Jiang et al., 'Impact of Ar addition to inductively coupled plasma etching of SiC in SF6/O2', Microelectron. Eng., (Mar. 18, 2004).
Notice of Reason for Refusal issued in corresponding Japanese patent application No. 2019-505020 dated Oct. 20, 2020.
Notice of Reason for Refusal issued in corresponding Japanese patent application No. 2022-31361dated Jan. 17, 2023.
Notice of Reason for Refusal issued in corresponding Japanese patent application No. 2022-31361dated Jun. 20, 2023.
O.W. Purbo et al., 'Reactive Ion Etching of SOI (SIMOX and ZMR) Silicon in Nitrogen Containing $CF_4 + O_2$ and $SF_6 + O_2$ Plasmas', the J. Electrochem. Soc., (Sep. 30, 1993).
Office Action dated Oct. 10, 2023 from Korean Patent Office for Korean Patent Application No. 10-2023-7023024.
Office Action issued in corresponding Korean Patent Application 1020170018561 mailed May 21, 2024.
Office Action issued in corresponding Korean Patent Application 10-2018-7028683 dated May 2, 2023.
Office Action issued in corresponding Korean Patent Application 10-2021-7027521 dated Dec. 20, 2021.
Office Action issued in corresponding Korean Patent Application No. 1020170018549 dated May 28, 2024.
Office Action issued in corresponding Korean Patent Application No. 10-2018-7028683 dated Dec. 29, 2022.
Taiwanese Office Action for Taiwanese Application No. 109109974 dated Jan. 4, 2024.
Taiwanese Office Action for Taiwanese Application No. 110126786 dated Oct. 16, 2023.
Taiwanese Office Action for Taiwanese Application No. 111104002 dated Mar. 8, 2023.
Office Action issued in corresponding Korean Patent Application 1020170013979 dated May 29, 2024.
International Search Report and Written Opinion of the ISA issued in PCT/US2020/045389, mailed Nov. 17, 2020; ISA/KR.
Translation of Second Office Action dated Feb. 16, 2021 corresponding to Japanese Application No. 2017-039058, 4 pages.
First Office Action corresponding to Taiwanese Patent Application No. 106106790 dated Oct. 7, 2020, 7 pages.
First Office Action corresponding to Chinese Patent Application No. 201710122891.1 dated Apr. 10, 2020, 14 pages.
Second Office Action corresponding to Chinese Patent Application No. 201710122891.1 dated Dec. 3, 2020, 5 pages.
MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.
First Office Action dated Dec. 29, 2017 corresponding to Chinese Patent Application No. 201610032252.1, 12 pages.
First Office Action dated Aug. 2, 2018 corresponding to Chinese Patent Application No. 201710036188.9, 7 pages.
Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
U.S. Office Action dated Oct. 5, 2015 issued in U.S. Appl. No. 14/576,020.
Blain et al. (Jul./Aug. 1996) "Role of nitrogen in the downstream etching of silicon nitride," Journal of Vacuum Science & Technology A, 14(4):2151-2157.
Blain (Mar./ Apr. 1999) "Mechanism of nitrogen removal from silicon nitride by nitric oxide," Journal of Vacuum Science & Technology A, 17(2):665-667.
Kastenmeier et al. (Nov./Dec. 1999) "Highly selective etching of silicon nitride over silicon and silicon dioxide," J. Vac. Sci. Techno!. A, American Vacuum Society, I7 (6):3179-3184.
Kastenmeier et al. (Sep./Oct. 1996) "Chemical dry etching of silicon nitride and silicon dioxide using CF4/02/N2 gas mixtures," J. Vac. Sci. Technol. A14(5):2802-2813.
Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.
Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.
US Final Ofice Action dated Feb. 26, 2016 issued in U.S. Appl. No. 14/576,020.
US Office Action dated Sep. 23, 2016 issued in U.S. Appl. No. 14/576,020.
European Extended Search Report dated May 30, 2016 issued in EP 15 199 363.1.

(56) References Cited

OTHER PUBLICATIONS

U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).
U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).
First Chinese Office Action for Chinese Application No. 201710013856.6 dated Oct. 21, 2019.
First Chinese Office Action for Chinese Application No. CN201710076420.1 issued Dec. 17, 2019. No translation provided. 11 pages.
First Office Action corresponding to Japanese Application No. 2018-186353, dated Jan. 21, 2020, 8 pages.
First Office Action corresponding to Japanese Application No. 2016-004302, dated Jan. 28, 2020, 4 pages.
First Office Action corresponding to Tiawanese Application No. 106104190, dated Sep. 4, 2020, 5 pages.
Office Action issued in corresponding Japanese Patent Application 2016-143886 dated Sep. 8, 2020.
Translation of First Office Action dated Sep. 28, 2020 corresponding to Korean Patent Application No. 10-2018-0114808, 3 pages.
Translation of Notification of Examination Opinions corresponding to Taiwanese Patent Application No. 106101332 dated Nov. 19, 2020, 9 pages.
D. A. Jobson. "On the Flow of a Compressible Fluid through Orifices." Proceedings of the Institution of Mechanical Engineers. 169[1](1955). pp. 767-776. https://doi.org/10.1243/PIME_PROC_1955_169_077_02 (Year: 1955).
Cashco, Inc. "Fluid Flow Basics ofThrottling Valves." 1999. pp. 1-56. Available Mar. 24, 2020 online at: https://www.controlglobal.com/assets/Media/MediaManager/RefBook_Cash co_Fluid. pdf. (Year: 1999).
O'Keefe Controls Co. "Choked Flow of Gases." in Catalog 11. 2003. pp. 20-24 & 48. (Year: 2003).
Christophe Corre. "Lecture 5: Quasi-1 D compressible Flows" in "Fundamentals of Compressible and Viscous Flow Analysis—Part II." 2018. pp. 94-148. Ecole Centrale de Lyon. Fluid Mechanics and Acoustics Laboratory (LMFA ). http://lmfa.ec-lyon. (Year: 2018).
Notification of Examination Opinions corresponding to Taiwanese Patent Application No. 10512352 dated Feb. 19, 2020, 5 pages.
First Office Action dated Mar. 17, 2020 corresponding to Chinese Patent Application 20170076027.2, 8 pages.
First Office Action with Translation dated Sep. 7, 2021 corresponding to Korean Patent Application No. 10-2017-0083210, 6 pages.
First Office Action with Translation dated Oct. 7, 2021 corresponding to Japanese Patent Application No. 2017-154893, 7 pages.
Notification of Search Report corresponding to Singapore Patent Application No. 10201808035Y dated Oct. 20, 2022, 11 pages.
Office Action dated May 29, 2023 from Korean Patent Office for Korean Patent Application No. 10-2021-0079769; 8 pages.
International Search Report and Written Opinon for PCT Applicaiton No. PCT/US2019/045085 dated Dec. 20, 2019.
Notification of Transmittal of International Search Report and the Written Opinion of the International Searching Authority dated Feb. 22, 2018, 16 pages.
International Search Report and Written Opinion issued in PCT/US2017/043527, mailed Apr. 20, 2018; ISA/KR.
International Search Report and Written Opinion issued in PCT/US2017/062769, mailed Aug. 21, 2018; ISA/KR.
Search Report dated Sep. 7, 2020 corresponding to European Application No. 17 919 402.2, 9 pages.
Machine Translation of Notice of Reasons for Refusal corresponding to Japanese Patent Application No. 2019-559033 dated Dec. 22, 2020, 4 pages.
Translation of Written Opinion corresponding to Singapore Application No. 11201907515W dated Mar. 15, 2020, 4 pages.
Translation of Notification of Examination Opinions dated May 4, 2020 corresponding to Taiwanese Patent Application No. 106142110, 7 pages.
Translation of Notification of Office Action dated Dec. 17, 2019 corresponding to Korean Patent Application No. 10-2018-7021511, 2 pages.
Translation of Notification of Office Action dated Jun. 26, 2020 corresponding to Korean Patent Application No. 10-2018-7021511, 2 pages.
Search Report dated Feb. 19, 2020 corresponding to European Application No. 17 932 862.0, 7 pages.
Office Action dated Dec. 1, 2020 corresponding to Japanese Application No. 2019-553416, 4 pages.
Translation of Decision of Refusal dated Feb. 3, 2021 corresponding to Taiwanese Patent Application No. 106142110, 4 pages.
Translation of Decision for Grant of Patent dated Jul. 28, 2020 corresponding to Korean Application No. 10-2018-7021879, 1 page.
Translation of Written Opinion corresponding to Singapore Application No. 11201908264Q dated Feb. 19, 2020, 7 pages.
Translation of Notification of Office Action dated Dec. 19, 2019 corresponding to Korean Patent Application No. 10-2018-7021879, 7 pages.
Translation of Notification of Office Action dated Mar. 29, 2020 corresponding to Korean Patent Application No. 10-2020-7004813, 3 pages.
Translation of Decision for Grant of Patent dated Feb. 24, 2021 corresponding to Korean Application No. 10-2020-7013289, 1 page.
Translation of Notification of Office Action dated Aug. 27, 2021 corresponding to Korean Patent Application No. 10-2021-7014539, 8 pages.
Decision for Grant of Patent for Korean Application No. 10-2021-7014539 dated Feb. 23, 2022.
Notice of Reasons for Refusal for Japanese Application No. 2021-75777 dated Jul. 12, 2022.
International Search Report and Written Opinion of the ISA issued in PCT/US2018/050273, mailed May 13, 2019; ISA/KR.
Notice of Reason for Refusal issued in corresponding Japanese patent application No. 2019-505020 dated Oct. 16, 2020.
Office Action issued in corresponding Korean Patent Application No. 10-2018-7028683 dated Nov. 26, 2020.
Office Action issued in corresponding Taiwanese Patent Application No. 10-2018-7028683 dated Nov. 26, 2020.
Office Action issued in corresponding Taiwanese Patent Application No. 109128923 dated May 11, 2021 (4 pages).
Office Action issued in corresponding Korean Patent Application No. 10-2018-7028683 dated Apr. 27, 2022.
Supplementary Partial European Search Report issued in corresponding European Patent Application No. 18929891 dated Mar. 18, 2022.
Office Action issued in corresponding Korean Patent Application 10-2018-7028683 dated Dec. 29, 2022.
Office Action issued in corresponding Japanese Patent Application 2022-31361 dated Jan. 17, 2023 (no English translation available).
Office Action issued in corresponding Taiwanese Patent Application 111104002 dated Mar. 6, 2023.
Office Action issued in corresponding Chinese Patent Application 201880002160.6 dated Mar. 23, 2023.
International Search Report and Written Opinion of the ISA issued in PCT/US2020/044168, mailed Nov. 17, 2020; ISA/KR.
International Search Report and Written Opinion of the ISA issued in PCT/US2021/052732, mailed Jan. 21, 2022; ISA/KR.
Supplementary Partial European Search Report issued in corresponding European Patent Application No. 20850609 dated Aug. 3, 2023.
U.S. Appl. No. 16/487,703, filed Aug. 21, 2019, Hiran Rajitha Rathnasinghe.
U.S. Appl. No. 16/497,091, filed Sep. 24, 2019, Hiran Rajitha Rathnasinghe.
U.S. Appl. No. 17/633,727, filed Feb. 8, 2022, Rohini Mishra.
U.S. Appl. No. 17/681,606, filed Feb. 25, 2022, Hiran Rajitha Rathnasinghe.
U.S. Appl. No. 18/758,576, filed Jun. 28, 2024.
U.S. Appl. No. 18/879,860, filed Dec. 30, 2024, Christopher Kimball.

(56) References Cited

OTHER PUBLICATIONS

U.S. Appl. No. 18/990,129, filed Dec. 20, 2024, Hiran Rajitha Rathnasinghe.
U.S. Appl. No. 19/054,216, filed Feb. 14, 2025, Hiran Rajitha Rathnasinghe.
U.S. Appl. No. 17/631,984, filed Feb. 1, 2022, Hui Ling Han.
U.S. Appl. No. 17/632,066, filed Feb. 1, 2022, Christopher Kimball.
U.S. Appl. No. 17/671,211, filed Feb. 14, 2022, Christopher Kimball.
U.S. Appl. No. 17/681,633, filed Feb. 25, 2022, Hiran Rajitha Rathnasinghe.
U.S. Appl. No. 18/029,708, filed Mar. 31, 2023, Christopher Kimball.
U.S. Appl. No. 18/377,141, filed Oct. 5, 2023, Alejandro Sanchez.
U.S. Appl. No. 18/758,576, filed Jun. 28, 2024, Haoquan Yan.
Allowance issued in corresponding Korean Application No. 1020170018561 dated Jan. 15, 2025.
Chinese Office Action for Chinese Application No. 202080057245.1 dated Oct. 17, 2024.
Decision to Grant a Patent in Corresponding Japanese Application No. 20220264247, dated Feb. 25, 2025.
Decision to Grant a Patent in Japanese Application No. 20220264247, dated Feb. 25, 2025.
Decision to Grant for Japanese Application No. 2023-11469 dated Apr. 10, 2024.
International Search Report and Written Opinion of the ISA issued in PCT/US2020/044816, mailed Nov. 13, 2020; ISA/KR.
International Search Report and Written Opinion of the ISA issued in PCT/US2022/043617, mailed Mar. 30, 2023; ISA/KR.
Japanese Office Action for Japanese Application No. 2023-129731 dated Sep. 10, 2024.
Office Action from corresponding Chinese Application No. 202210228466.1, dated Oct. 30, 2024.
Office Action from corresponding Korean Application No. 10-2023-7037449, dated Jul. 22, 2024.
Office Action from corresponding Taiwanese Application No. 112149171, dated Nov. 13, 2024.
Search Report from corresponding Singaporean Application No. 11202201065W, dated May 28, 2024.
Taiwanese Office Action for Taiwanese Application No. 110136825 dated Jan. 16, 2025.
Taiwanese Office Action from corresponding Taiwanese Application No. 109126470 dated Jun. 28, 2024.

\* cited by examiner

MID-RING EROSION COMPENSATION IN SUBSTRATE PROCESSING SYSTEMS

CROSS-REFERENCE TO RELATED APPLICATIONS

This application is a U.S. National Phase Application under 35 U.S.C. 371 of International Application No. PCT/US2020/024333, filed on Mar. 23, 2020. The entire disclosure of the application referenced above is incorporated herein by reference.

FIELD

The present disclosure relates generally to substrate processing systems and more particularly to mid-ring erosion compensation in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD), a chemically enhanced plasma vapor deposition (CEPVD), a sputtering physical vapor deposition (PVD), atomic layer deposition (ALD), and plasma enhanced ALD (PEALD). Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. A computer-controlled robot typically transfers substrates from one processing chamber to another in a sequence in which the substrates are to be processed. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. The processing chambers are periodically cleaned by supplying a cleaning gas into the processing chamber and striking plasma.

SUMMARY

A substrate processing system comprises a substrate support assembly to support a semiconductor substrate during processing of the semiconductor substrate in the substrate processing system. A first edge ring is arranged around the substrate support assembly. The first edge ring is movable relative to the substrate support assembly. A second edge ring is arranged around the substrate support assembly and under the first edge ring. A controller is configured to compensate a height of the first edge ring based on erosion of the first and second edge rings.

In another feature, the controller is further configured to determine the erosion of the first and second edge rings based on number of hours for which the first and second edge rings are exposed to RF power supplied during the processing of the semiconductor substrate.

In another feature, the controller is further configured to move the first edge ring relative to the substrate support assembly during the processing of the semiconductor substrate according to the compensated height.

In other features, the controller is further configured to determine a first number of hours for which the first edge ring is exposed to RF power supplied during the processing of the semiconductor substrate. The controller is further configured to determine a first rate at which the first edge ring erodes due to the processing of the semiconductor substrate. The controller is further configured to determine a second number of hours for which the second edge ring is exposed to the RF power. The controller is further configured to determine a second rate at which the second edge ring erodes due to the processing of the semiconductor substrate and due to a movement of the first edge ring. The controller is further configured to compensate the height of the first edge ring based on the first and second number of hours and the first and second rates.

In other features, the controller is further configured to determine a first amount by which to compensate the height of the first edge ring based on the first number of hours and the first rate. The controller is further configured to determine a second amount by which to compensate the height of the first edge ring based on the second number of hours and the second rate. The controller is further configured to compensate the height of the first edge ring based on a sum of the first and second amounts.

In other features, the controller is further configured to determine a shift in height of a tunable edge sheath of plasma used during the processing relative to a preceding first edge ring. The controller is further configured to determine a tuning factor to compensate the height of the first edge ring based on the shift in height of the tunable edge sheath of plasma and based on a last amount used to compensate a height of the preceding first edge ring. The controller is further configured to determine the first amount by which to compensate the height of the first edge ring based on the first number of hours, the first rate, and the tuning factor. The controller is further configured to determine the second amount by which to compensate the height of the first edge ring based on the second number of hours, the second rate, and the tuning factor.

In another feature, the controller is further configured to determine the shift in height of the tunable edge sheath of plasma based on normalized ratios of edge to center etch rates or based on a shift of critical dimension on the semiconductor substrate.

In another feature, the tuning factor is a ratio of the shift in height of the tunable edge sheath of plasma to the last amount used to compensate the height of the preceding first edge ring.

In another feature, the controller is further configured to determine the first rate based on process performance on the semiconductor substrate relative to plasma on time.

In other features, the controller is further configured to determine a correlation between a number of hours for which the second edge ring is exposed to the RF power and an erosion rate of the second edge ring. The controller is further configured to determine the second rate based on the correlation.

In still other features, a method for a substrate processing system comprises arranging a first edge ring around a pedestal in the substrate processing system, arranging a second edge ring around the pedestal under the first edge ring, and compensating a height of the first edge ring based on erosion of the first and second edge rings.

In another feature, the method further comprises determining the erosion of the first and second edge rings based on number of hours for which the first and second edge rings are exposed to RF power supplied during processing of a semiconductor substrate.

In another feature, the method further comprises moving the first edge ring relative to the pedestal during processing of a semiconductor substrate according to the compensated height.

In other features, the method further comprises counting a first number of hours for which the first edge ring is exposed to RF power supplied during processing of a semiconductor substrate. The method further comprises determining a first rate at which the first edge ring erodes due to the processing of the semiconductor substrate. The method further comprises counting a second number of hours for which the second edge ring is exposed to the RF power. The method further comprises determining a second rate at which the second edge ring erodes due to the processing and due to a movement of the first edge ring. The method further comprises compensating the height of the first edge ring based on the first and second number of hours and the first and second rates.

In other features, the method further comprises determining a first amount by which to compensate the height of the first edge ring based on the first number of hours and the first rate. The method further comprises determining a second amount by which to compensate the height of the first edge ring based on the second number of hours and the second rate. The method further comprises compensating the height of the first edge ring based on a sum of the first and second amounts.

In other features, the method further comprises determining a shift in height of a tunable edge sheath of plasma used during the processing relative to a preceding first edge ring. The method further comprises determining a tuning factor to compensate the height of the first edge ring based on the shift in height of the tunable edge sheath of plasma and based on a last amount used to compensate a height of the preceding first edge ring. The method further comprises determining the first amount by which to compensate the height of the first edge ring based on the first number of hours, the first rate, and the tuning factor. The method further comprises determining the second amount by which to compensate the height of the first edge ring based on the second number of hours, the second rate, and the tuning factor.

In another feature, the method further comprises determining the shift in height of the tunable edge sheath of plasma based on normalized ratios of edge to center etch rates or based on a shift of critical dimension on the semiconductor substrate.

In another feature, the method further comprises determining the tuning factor as a ratio of the shift in height of the tunable edge sheath of plasma to the last amount used to compensate the height of the preceding first edge ring.

In another feature, the method further comprises determining the first rate based on process performance on the semiconductor substrate relative to plasma on time.

In other features, the method further comprises determining a correlation between a number of hours for which the second edge ring is exposed to the RF power and an erosion rate of the second edge ring, and determining the second rate based on the correlation.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
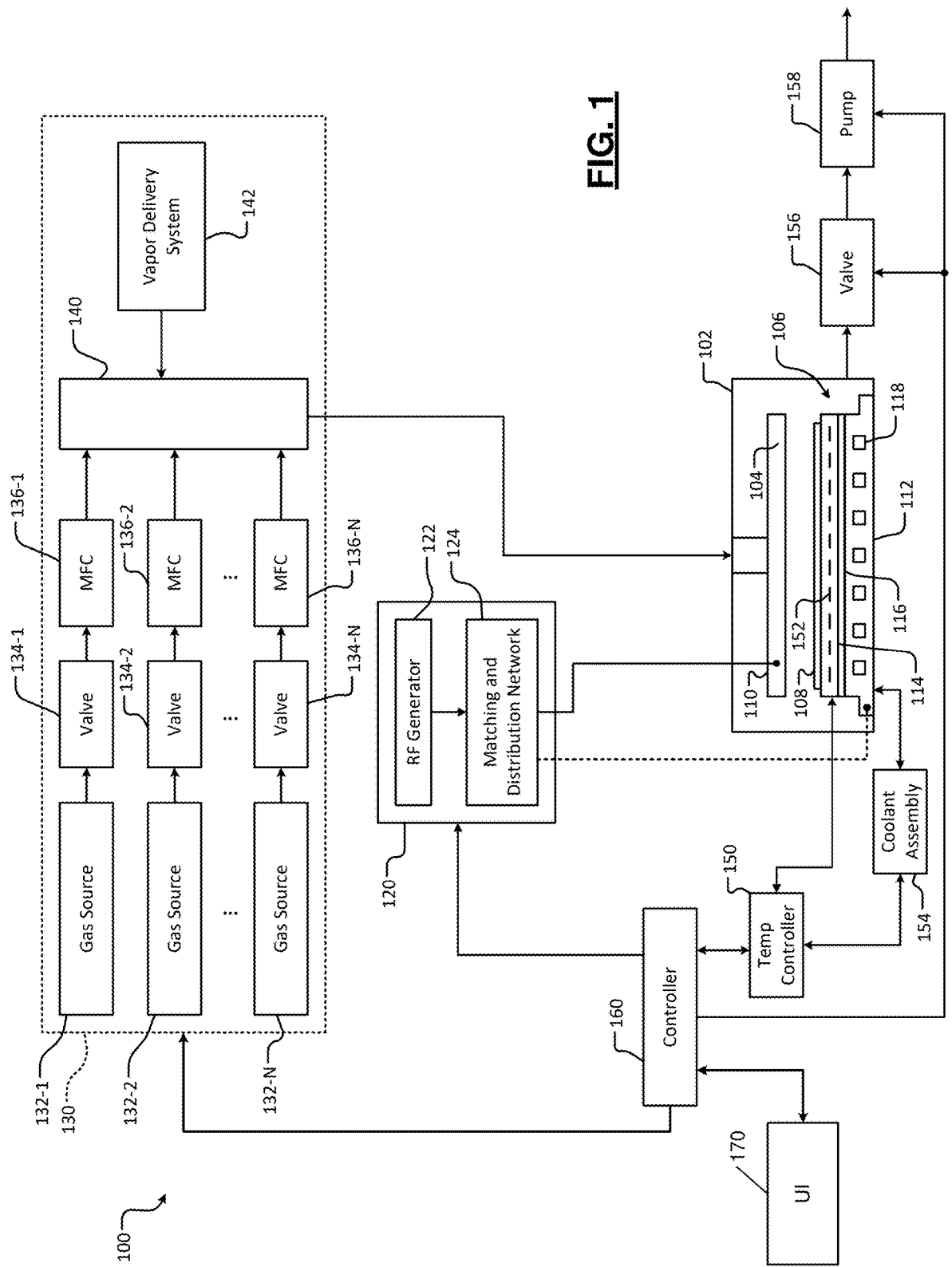
FIG. 1 shows an example of a substrate processing system including a processing chamber.

In processing chambers performing plasma etch processes on semiconductor substrates (typically under vacuum), an edge coupling ring (called a top ring) is arranged around the substrate support assembly to help shape the plasma such that uniform etching of the substrate occurs. After some use, an upper surface of the top ring may exhibit erosion due to the etch processes performed on the substrates. As a result, the plasma may tend to etch a radially outer edge of the substrate at a different rate than radially inner portions of the substrate, and non-uniform etching of the substrate may occur.

To alleviate this problem, lift pins are used to move the top ring up as its top surface gets eroded. The top ring is moved up gradually such that an edge of the top ring is higher relative to a top surface of the substrate. The movement of the top ring changes an edge coupling effect of the plasma relative to the substrate during etching or other substrate treatment. As a result, etch uniformity is improved. The top ring is moved up gradually to maintain an optimal height of the top ring above the substrate support assembly during the lifetime of the top ring.

After some amount of wear due to the erosion, the top ring is replaced with a new top ring. The top ring can be replaced without opening the chamber. Specifically, a robot arm is used to transport the top ring out of the processing chamber and to insert a new top ring into the processing chamber without breaking vacuum.

Under the top ring, a second ring (mid-ring) is arranged surrounding the substrate support assembly. The second ring is called a middle ring or simply mid-ring since there are additional annular structures or rings (e.g., a bottom ring) under the second ring. Unlike the top ring, which is movable, the mid-ring cannot be moved from the processing chamber using the robot arm since it typically has a diameter larger than a port of the processing chamber. An inner edge portion of the mid-ring typically extends under the outer edge of the substrate (called wafer overhang or wafer pocket) and is partially exposed to plasma. As the top ring is moved up during use, the mid-ring begins to erode due to the etch processes performed in the processing chamber. Unlike the top ring, however, which can be replaced without opening the processing chamber, the mid-ring cannot be replaced without opening the chamber.

While the top ring is replaced when eroded, the mid-ring continues to erode. The mid-ring erosion is particularly pronounced under the wafer pocket. The mid-ring erosion causes stroke loss (explained below with reference to FIG. 3), which in turn contributes to etch rate non-uniformity across the wafer.

The present disclosure provides a mid-ring erosion compensation method to automatically tune the top ring height to account for top ring and mid-ring erosion and also to ensure full tuning stroke throughout the lifetime of the top ring. Accordingly, the processing chamber need not be opened to replace the mid-ring within mean time between cleaning (MTBC). In other words, the MTBC can be extended. The mid-ring erosion compensation method provides benefits including high edge yield, high MTBC, and low cost of consumables (CoC).

Specifically, the amount of reduction in top ring tuning stroke varies linearly relative to the amount of mid-ring erosion, especially at location under the wafer overhang. The erosion rate of the mid-ring at that location varies linearly relative to the number of RF hours (i.e., total number of hours for which the mid-ring is subjected or exposed to RF power). The present disclosure provides a method to compensate the stroke loss due to the mid-ring erosion so that the processing chamber need not be opened to replace the mid-ring within mean time between cleaning (MTBC).

More specifically, the method tracks the RF hours used on the top and middle edge rings and generates a tuning factor that can be entered via a user interface (UI) based on the process etch rate data. The tuning factor fine tunes the height of the top ring and compensates for mid-ring erosion to ensure full tuning stroke throughout the lifetime of the top ring. These and other features of the present disclosure are described below in detail.

The present disclosure is organized as follows. Initially, an example of a processing chamber is shown and described with reference to FIG. 1 to illustrate where the mid-ring erosion compensation method according to the present disclosure can be used. FIG. 2 shows an example of an arrangement of the top ring and the mid-ring. Thereafter, the mid-ring erosion compensation method is described in detail with reference to FIGS. 3-5.

FIG. 1 shows an example of a substrate processing system 100 comprising a processing chamber 102 configured to generate capacitively coupled plasma. The processing chamber 102 that encloses other components of the substrate processing system 100 and contains RF plasma (if used). The processing chamber 102 comprises an upper electrode 104 and an electrostatic chuck (ESC) 106 or other type of substrate support. During operation, a substrate 108 is arranged on the ESC 106.

For example, the upper electrode 104 may include a gas distribution device 110 such as a showerhead that introduces and distributes process gases. The gas distribution device 110 may include a stem portion including one end connected to a top surface of the processing chamber 102. A base portion of the showerhead is generally cylindrical and extends radially outwardly from an opposite end of the stem portion at a location that is spaced from the top surface of the processing chamber 102. A substrate-facing surface or faceplate of the base portion of the showerhead includes a plurality of holes through which vaporized precursor, process gas, cleaning gas or purge gas flows. Alternately, the upper electrode 104 may include a conducting plate, and the gases may be introduced in another manner.

The ESC 106 comprises a baseplate 112 that acts as a lower electrode. The baseplate 112 supports a heating plate 114, which may correspond to a ceramic multi-zone heating plate. A thermal resistance layer 116 may be arranged between the heating plate 114 and the baseplate 112. The baseplate 112 may include one or more channels 118 for flowing coolant through the baseplate 112.

If plasma is used, an RF generating system (or an RF source) 120 generates and outputs an RF voltage to one of the upper electrode 104 and the lower electrode (e.g., the baseplate 112 of the ESC 106). The other one of the upper electrode 104 and the baseplate 112 may be DC grounded, AC grounded, or floating. For example, the RF generating system 120 may include an RF generator 122 that generates RF power that is fed by a matching and distribution network 124 to the upper electrode 104 or the baseplate 112. In other examples, while not shown, the plasma may be generated inductively or remotely and then supplied to the processing chamber 102.

A gas delivery system 130 includes one or more gas sources 132-1, 132-2, . . . , and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. A vapor delivery system 142 supplies vaporized precursor to the manifold 140 or another manifold (not shown) that is connected to the processing chamber 102. An output of the manifold 140 is fed to the processing chamber 102. The gas sources 132 may supply process gases, cleaning gases, and/or purge gases.

A temperature controller 150 may be connected to a plurality of thermal control elements (TCEs) 152 arranged in the heating plate 114. The temperature controller 150 may be used to control the plurality of TCEs 152 to control a temperature of the ESC 106 and the substrate 108. The temperature controller 150 may communicate with a coolant assembly 154 to control coolant flow through the channels 118. For example, the coolant assembly 154 may include a coolant pump, a reservoir, and one or more temperature sensors (not shown). The temperature controller 150 operates the coolant assembly 154 to selectively flow the coolant through the channels 118 to cool the ESC 106. A valve 156 and pump 158 may be used to evacuate reactants from the processing chamber 102.

A system controller 160 controls the components of the substrate processing system 100. A user interface (UI) 170 interfaces with the substrate processing system via the system controller 160.

Figure 2A:
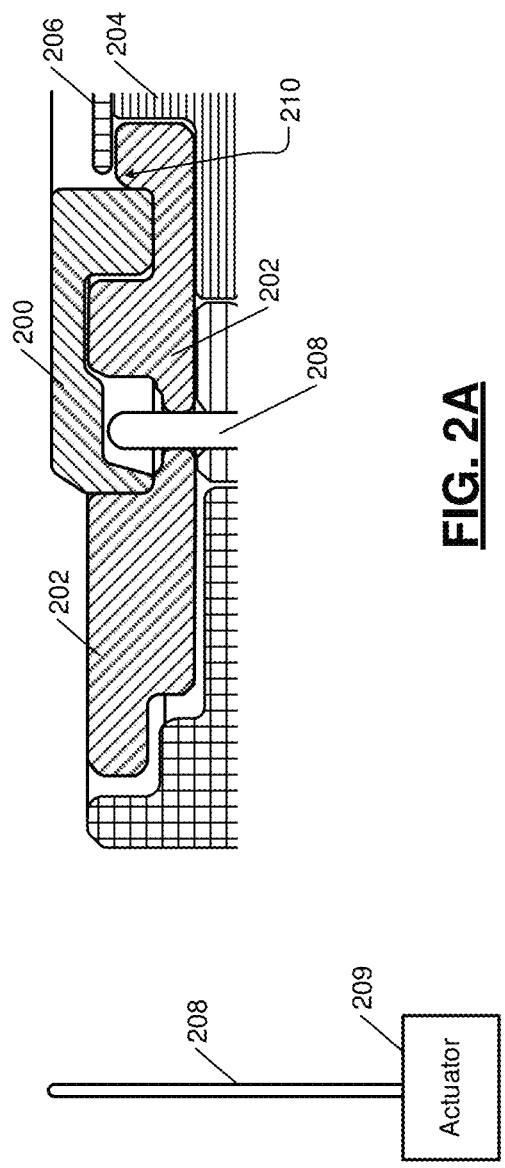
FIGS. 2A and 2B show an example of a partial cross-section of a substrate support assembly including a top ring and a mid-ring.
Figure 2B:
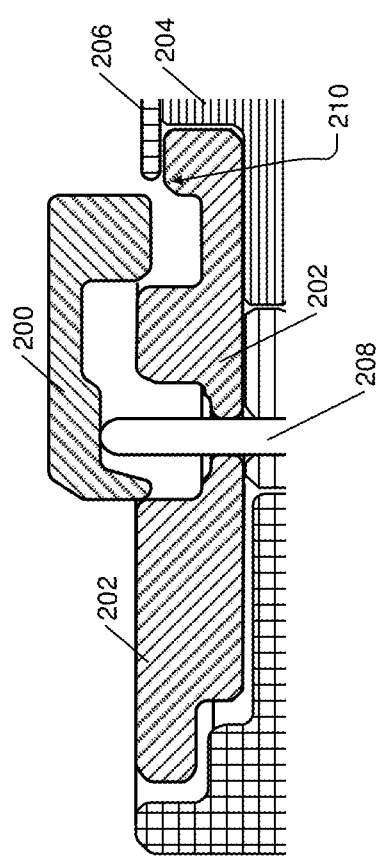

FIGS. 2A and 2B show an example of a partial cross-section of a substrate support assembly. The example shows a top ring 200 and a mid-ring 202 surrounding a substrate support assembly 204. A substrate 206 is arranged on the substrate support assembly 204. A lift pin 208 and an actuator 209 are used to lift the top ring 200. While only one lift pin 208 is shown in the partial cross-section, it is understood that a plurality of lift pins 208 and respective actuators 209 are used to lift the top ring 200. Examples of actuators 209 include piezoelectric actuators, stepper motors, pneumatic drives, or other suitable actuators. The actuators 209 are controlled by the system controller 160 (shown in FIG. 1).

As the top ring 200 is raised (see FIG. 2B), an inner edge portion 210 of the mid-ring 202 under the outer edge of the substrate 206 (called wafer pocket) begins to erode. The erosion rate of the mid-ring 202 under the wafer pocket (i.e., at location 210) varies linearly relatively to the RF hours (i.e., the total number of hours for which the mid-ring 202 is subjected or exposed to RF power). Further, regardless of the type of material used for the top ring 200 (e.g., quartz, silicon carbide, etc.), the stroke loss of the top ring 200 due to the erosion of the mid-ring 202 varies linearly relative to the mid-ring erosion.

Figure 3:
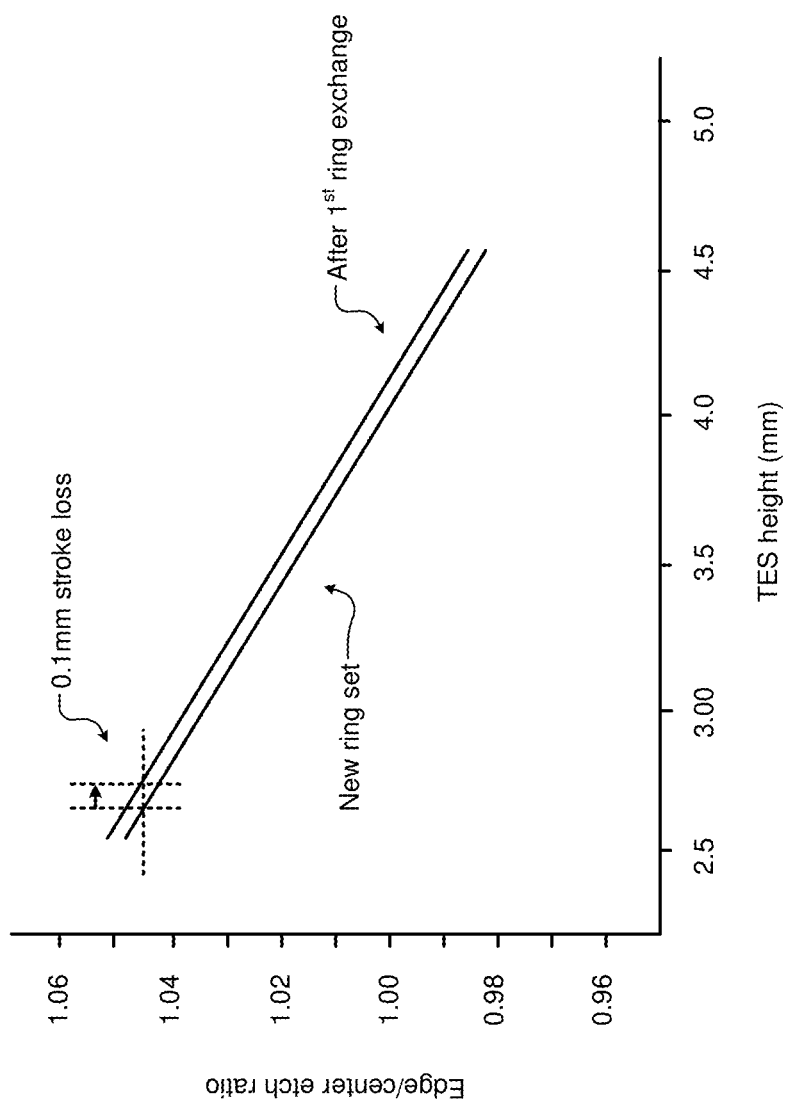
FIG. 3 shows an example of stroke loss using a graph of ratios of edge to center etch rates relative to height of tunable edge sheath (TES) of plasma.

FIG. 3 shows an example of stroke loss using a graph. The graph shows variation of a ratio of normalized edge to center etch rates of a wafer relative to a height of tunable edge sheath (TES) of plasma. For example, for a given etch process, there may be a base height for the top ring 200 and the TES. The TES height increases with the magnitude of the stroke provided by raising the top ring 200 above the base height. For example, the base height for the top ring 200 and the TES may be 2.57 mm. For a 0.5 mm stroke, the TES height may be 3.07 mm; for a 1 mm stroke, the TES height may be 3.57 mm; for a 1.5 mm stroke, the TES height may be 4.07 mm; and for a 2 mm stroke, the TES height may be 4.57 mm.

Each time a new top ring 200 is installed, the continued erosion of the mid-ring 202 causes stroke loss (e.g., 1 mm shown in FIG. 3). That is, raising the top ring 200 by a given distance (e.g., 0.5 mm) does not change the TES height by the expected amount. The stroke loss increases progressively with each successive top ring 200 until the mid-ring 202 is replaced.

To account for the stroke loss until the mid-ring 202 is replaced, the height of the TES of the plasma can be manipulated by tuning the height of the top ring 200, which in turn helps maintain etch rate uniformity across the wafer. A tuning factor for tuning the height of the top ring 200 is determined (e.g., by the system controller 160 shown in FIG. 1) as follows.

To determine the tuning factor, an amount of shift in the TES height after the top ring replacement is quantified (e.g., "s" mm). A previous height compensation amount (e.g., "a" mm) for the top ring 200 (described below), determined prior to the top ring replacement, is retrieved from memory (e.g., of the system controller 160). The tuning factor is s/a (i.e., s divided by a).

A compensation amount "a" for the installed top ring 200 is determined as follows (e.g., by the system controller 160 shown in FIG. 1). A number of RF hours for the installed top ring 200 is counted using a first counter (e.g., in the system controller 160). The first counter is reset each time the top ring 200 is replaced and a new top ring 200 is installed. The number of RF hours for the installed mid-ring 202 is counted using a second counter (e.g., in the system controller 160). The second counter is not reset each time the top ring 200 is replaced. The second counter is not reset until the mid-ring 202 is replaced.

An erosion rate of the installed top ring 200 is determined (e.g., by the system controller 160 shown in FIG. 1). For example, the erosion rate of the installed top ring 200 can be determined empirically by the system controller 160 based on the number of RF hours for which the installed top ring 200 is subjected or exposed to RF power. Alternatively, the top ring 200 can be transported to an airlock chamber, and a measurement system such as an optical measurement system can be used to scan the top ring 200 and to measure the erosion on the top ring 200 from the data collected by the scanning. By repeating these measurements periodically (e.g., daily), the erosion rate of the top ring 200 can be determined.

An erosion rate of the mid-ring 202 is determined based on the number of RF hours counted by the second counter (e.g., by the system controller 160 shown in FIG. 1). For example, for a given etch process, empirical data may be used to establish a correlation between the number of RF hours and the erosion rate of the mid-ring 202. Using the correlation and the number of RF hours counted by the second counter, the erosion rate of the mid-ring 202 is determined.

The total compensation "a" for the installed top ring 200 is a sum of two terms (determined by the system controller 160 shown in FIG. 1): top ring compensation for the installed top ring 200 and mid-ring compensation for the mid ring 202. The top ring compensation is a product (i.e., multiplication) of the top ring erosion rate, the RF hour count of the first counter, and a third term (1−Tuning Factor) or (1−(s/a')), where a' is the last compensation amount for the top ring prior to the top ring replacement, which can be stored in memory in the system controller 160. The mid-ring compensation is a product (i.e., multiplication) of the mid-ring erosion rate, the RF hour count of the second counter, and a third term equal to the Tune Factor (i.e., s/a').

Figure 4:
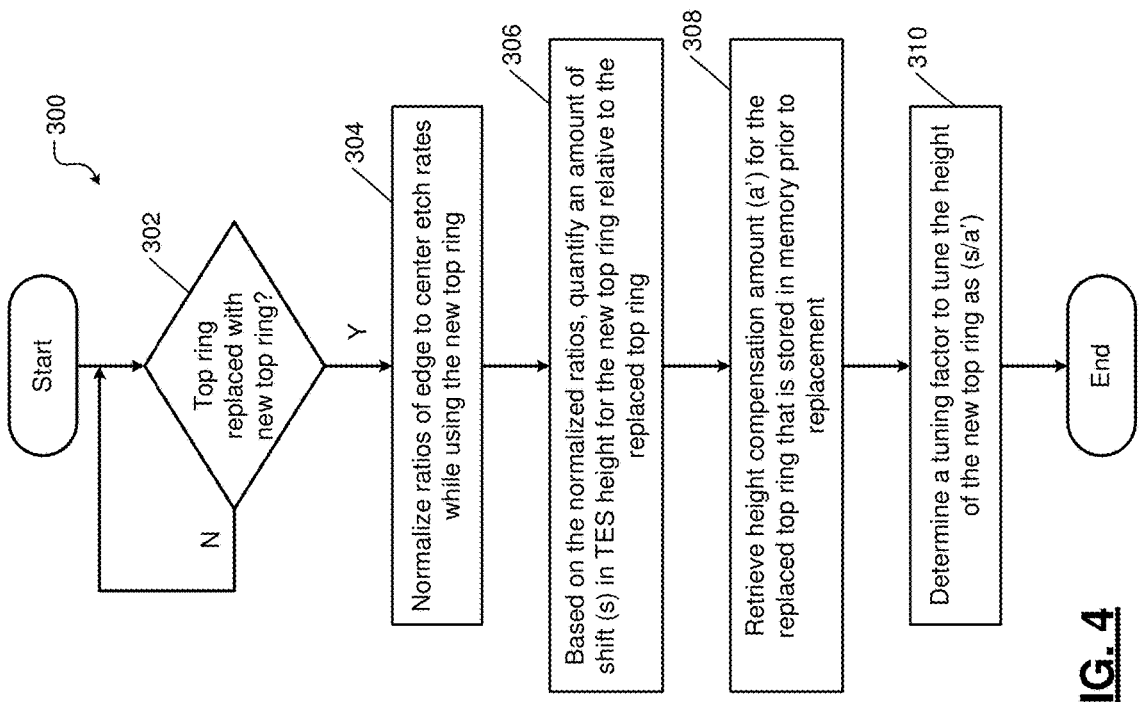
FIG. 4 shows a method for determining a tuning factor to tune height of the top ring according to the present disclosure.

FIG. 4 shows a method 300 for determining the tuning factor with which to tune the height of the top ring 200 according to the present disclosure. For example, the method 300 may be performed by the system controller 160 shown in FIG. 1. At 302, the method 300 determines if the top ring is replaced by a new top ring. If the top ring is replaced, at 304, the method 300 collects etch rate data for an etch process performed on wafers using the new top ring and normalizes ratios of edge to center etch rates for the wafers or, the sensitivity of wafer critical dimension (CD) to the TES height.

At 306, based on the normalized ratios, or the sensitivity of wafer critical dimension (CD) to the TES height, the method 300 quantifies (i.e., measures or determines) the amount of shift (s) in the height of the TES for the new top ring relative to the TES height for the replaced top ring. At 308, the method 308 retrieves a last value of height compensation amount (a') for the replaced top ring that is stored in memory (e.g., of the system controller 160) prior to replacing the top ring. At 310, the method 300 determines the tuning factor to tune the height of the new top ring as the ratio (s/a').

Figure 5:
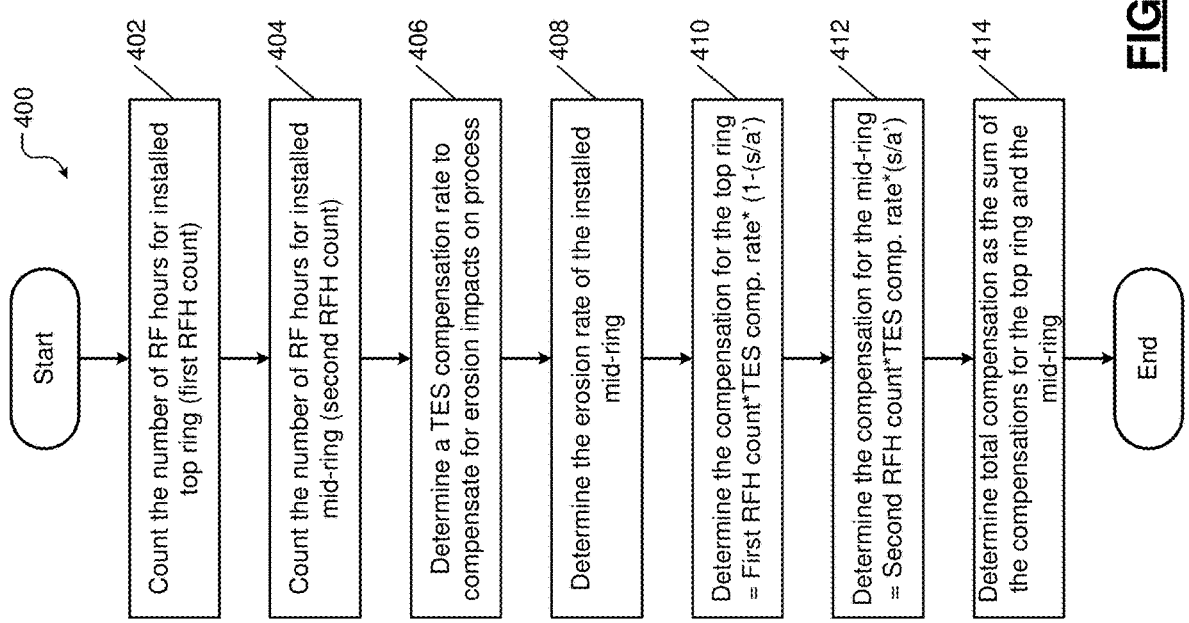
FIG. 5 shows a method for tuning the height of the top ring using the tuning factor determined according to the method shown in FIG. 4.

FIG. 5 shows a method 400 for tuning the height of the new top ring using the tuning factor determined according to the method 300. At 402, the method 400 counts the number of RF hours (RFH) for the newly installed top ring (called the first RFH count). At 404, the method 400 counts the number of RF hours for the mid-ring (called the second RFH count). At 406, the method 400 determines a TES compensation rate (mm/RF Hour) to compensate for the erosion impacts on the process (e.g., based on process performance on the semiconductor substrate relative to plasma on time). At 408, the method 400 determines an erosion rate of the mid-ring. At 410, the method 400 determines a compensation amount for the newly installed top ring, which is equal to the product First RFH count*TES compensation rate*(1−(s/a')), where (s/a') is determined according to the method 300.

At 412, the method 400 determines the compensation for the mid-ring, which is equal to the product Second RFH count*TES compensation rate*(s/a'), where (s/a') is determined according to the method 300. At 414, the method 400 determines a total compensation amount for the height of the newly installed top ring, which is the sum of the top ring compensation and the mid-ring compensation. By compensating the height of the top ring by the total compensation amount, the stroke loss due to the erosion of the mid-ring is compensated.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another are within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
   a substrate support assembly to support a semiconductor substrate during processing of the semiconductor substrate in the substrate processing system;
   a first edge ring arranged around the substrate support assembly, the first edge ring being movable relative to the substrate support assembly;
   a second edge ring arranged around the substrate support assembly and under the first edge ring; and
   a controller configured to compensate a height of the first edge ring based on erosion of the first and second edge rings, wherein the controller is configured to:
   determine a first number of hours for which the first edge ring is exposed to RF power supplied during the processing of the semiconductor substrate;
   determine a first rate at which the first edge ring erodes due to the processing of the semiconductor substrate;
   determine a second number of hours for which the second edge ring is exposed to the RF power;
   determine a second rate at which the second edge ring erodes due to the processing of the semiconductor substrate and due to a movement of the first edge ring; and
   determine a first amount by which to compensate the height of the first edge ring based on the first number of hours and the first rate;
   determine a second amount by which to compensate the height of the first edge ring based on the second number of hours and the second rate;
   compensate the height of the first edge ring based on the first and second amounts, wherein the compensated height is equal to a sum of the first and second amounts; and
   move the first edge ring relative to the substrate support assembly during the processing of the semiconductor substrate according to the compensated height.

2. The substrate processing system of claim 1 wherein the controller is further configured to:
   determine a shift in height of a tunable edge sheath of plasma used during the processing relative to a previously used first edge ring preceding the first edge ring;
   determine a tuning factor to compensate the height of the first edge ring based on the shift in height of the tunable edge sheath of plasma and based on a last compensation amount used to compensate a height of the previously used first edge ring preceding the first edge ring;
   determine the first amount by which to compensate the height of the first edge ring based on the first number of hours, the first rate, and the tuning factor; and
   determine the second amount by which to compensate the height of the first edge ring based on the second number of hours, the second rate, and the tuning factor.

3. The substrate processing system of claim 2 wherein the controller is further configured to determine the shift in height of the tunable edge sheath of plasma based on normalized ratios of edge to center etch rates or based on a shift of critical dimension on the semiconductor substrate.

4. The substrate processing system of claim 2 wherein the tuning factor is a ratio of the shift in height of the tunable edge sheath of plasma to the last compensation amount used to compensate the height of the previously used first edge ring preceding the first edge ring.

5. The substrate processing system of claim 1 wherein the controller is further configured to determine the first rate based on process performance on the semiconductor substrate relative to plasma on time.

6. The substrate processing system of claim 1 wherein the controller is further configured to:
   determine a correlation between a number of hours for which the second edge ring is exposed to the RF power and an erosion rate of the second edge ring; and
   determine the second rate based on the correlation.

* * * * *